United States Patent
Joshi

(12) 
(10) Patent No.: US 6,294,403 B1
(45) Date of Patent: Sep. 25, 2001

(54) HIGH PERFORMANCE FLIP CHIP PACKAGE

(76) Inventor: Rajeev Joshi, 10168 Colby Ave., Cupertino, CA (US) 95014

(*) Notice: Subject to any disclaimer, the term of this patent is extended or adjusted under 35 U.S.C. 154(b) by 0 days.

(21) Appl. No.: 09/522,328

(22) Filed: Mar. 9, 2000

Related U.S. Application Data

(62) Division of application No. 09/129,663, filed on Aug. 5, 1998.

(51) Int. Cl.⁷ .......................... H01L 21/44; H01L 21/48; H01L 21/50
(52) U.S. Cl. .............................................. 438/106; 438/15
(58) Field of Search .................. 438/15, 106, 108, 438/122, 51, 55, 64

(56) References Cited

U.S. PATENT DOCUMENTS

| | | | |
|---|---|---|---|
| 3,561,107 | 2/1971 | Best et al. ........................... | 29/577 |
| 3,871,014 | 3/1975 | King et al. ........................... | 357/67 |
| 3,972,062 | 7/1976 | Hopp .................................... | 357/68 |
| 4,021,838 | 5/1977 | Warwick ............................... | 357/68 |
| 4,604,644 | 8/1986 | Beckham et al. .................... | 357/80 |
| 5,075,965 | 12/1991 | Carey et al. ......................... | 29/840 |
| 5,217,922 | 6/1993 | Akasaki et al. ..................... | 438/613 |
| 5,219,794 | 6/1993 | Satoh et al. ......................... | 438/613 |
| 5,311,402 | 5/1994 | Kobayashi et al. ................. | 361/760 |
| 5,313,366 | 5/1994 | Gaudenzi et al. ................... | 361/760 |
| 5,367,435 | 11/1994 | Andros et al. ....................... | 361/749 |
| 5,371,404 | 12/1994 | Juskey et al. ........................ | 257/778 |
| 5,381,039 | 1/1995 | Morrison ............................. | 257/701 |
| 5,394,490 | 2/1995 | Kato et al. ............................ | 385/14 |
| 5,397,921 | 3/1995 | Karnezos ............................. | 257/779 |
| 5,447,886 | 9/1995 | Rai ....................................... | 437/183 |
| 5,448,114 | 9/1995 | Kondoh et al. ...................... | 257/778 |
| 5,454,160 | 10/1995 | Nickel .................................. | 29/840 |
| 5,477,087 | 12/1995 | Kawakita et al. .................... | 257/737 |
| 5,510,758 | 4/1996 | Fujita et al. ......................... | 333/247 |
| 5,512,786 | 4/1996 | Inamura et al. ..................... | 257/780 |
| 5,532,512 | 7/1996 | Fillion et al. ........................ | 257/686 |
| 5,554,887 | 9/1996 | Sawai et al. ......................... | 257/778 |
| 5,654,590 | 8/1997 | Kuramochi ........................... | 257/778 |
| 5,703,405 | 12/1997 | Zeber ................................... | 257/777 |
| 5,726,489 | 3/1998 | Matsuda et al. ..................... | 257/778 |
| 5,726,501 | 3/1998 | Matsubara ........................... | 257/778 |
| 5,726,502 | 3/1998 | Beddingfield ....................... | 257/797 |
| 5,729,440 | 3/1998 | Jimarez et al. ...................... | 361/779 |
| 5,734,201 | 3/1998 | Djennas et al. ..................... | 257/783 |
| 5,739,585 | 4/1998 | Akram et al. ........................ | 257/698 |
| 5,767,575 | * 6/1998 | Lan et al. ............................. | 257/701 |
| 5,814,894 | 9/1998 | Igarashi et al. ..................... | 257/778 |
| 5,878,869 | 3/1999 | Hoffman et al. .................... | 257/691 |
| 6,034,427 | * 3/2000 | Lan et al. ............................. | 257/698 |
| 6,064,066 | * 5/2000 | Bevan et al. ......................... | 250/345 |

FOREIGN PATENT DOCUMENTS

| | | | |
|---|---|---|---|
| 3-287635 | 1/1991 | (JP) .............................. | H01L/25/065 |

\* cited by examiner

Primary Examiner—David Nelms
Assistant Examiner—David Nhu
(74) Attorney, Agent, or Firm—Townsend and Townsend and Crew LLP

(57) ABSTRACT

An improved semiconductor package that reduces package resistance to a negligible level, and offers superior thermal performance. A silicon die is attached to a carrier (or substrate) that has a cavity substantially surrounding the die. Direct connection of the active surface of the silicon die to the printed circuit board is then made by an array of solder bumps that is distributed across the surface of the die as well as the edges of the carrier surrounding the die.

4 Claims, 3 Drawing Sheets

HIGH PERFORMANCE FLIP CHIP PACKAGE

This application is a division of and claims the benefit of U.S. patent application Ser. No. 09/129,663, filed Aug. 5, 1998, the disclosure of which is incorporated herein by reference.

BACKGROUND OF THE INVENTION

The present invention relates in general to semiconductor packaging and in particular to an apparatus and method of manufacture for a high performance flip chip package for semiconductor devices.

While silicon process technology has advanced significantly in the past decade, for the most part, the same decades-old package technology continues as the primary packaging means. Epoxy or solder die attach along with aluminum or gold wire bonding to lead frame is still the preferred semiconductor package methodology. Advances in semiconductor processing technology, however, have made the parasitics associated with conventional packages more of a performance limiting factor. This is particularly true in the case of power switching devices where, as in the case of power MOSFETs, the on-resistance of these devices continues to push the lower limits. Thus, the parasitic resistance introduced by the bond wires and the lead frame in conventional packages becomes much more significant for such high current devices as power MOSFETs. Furthermore, the continuous shrinking of geometries and the resulting increase in chip densities has given rise to an increasing demand for semiconductor packages with lead counts higher than that offered by the conventional packaging techniques.

Ball grid array and flip chip technologies were developed to address some of these demands. Both of these packaging technologies provide for a more direct connection between the silicon die and the printed circuit board as well as providing for higher interconnect densities. There is always room for improvement however. For example, a typical ball grid array package consists of a BT resin laminated board which serves as an interposer layer between the silicon die and the printed circuit board (PCB). Because of poor heat dissipation from the laminated board, external heat sinks and additional PCB copper layers are often required to dissipate excess heat.

FIELD OF THE INVENTION

In the case of conventional flip chip technology, among other shortcomings, heat dissipation is essentially governed by the die size and connection to the back side of the die is not easily facilitated (often requiring a bond wire connection). These limitations (poor heat dissipation and resistive contact to back side) become quite significant in high current applications such as power switching devices. A substantial improvement in the performance of flip chip packages is offered by Bencuya et al. in commonly assigned provisional Patent Application No. 60/088,651, entitled "Low Resistance Package for Semiconductor Devices." In one embodiment, this improved package eliminates wire bonding by making direct connection between an array of solder balls on one conductive surface of the die and a lead frame element, while connection to the opposite side is made by a die attached mechanism. This package exhibits significantly lower resistance; however, it still relies on a lead frame which adds residual resistance to the current path, and is not the smallest package possible for a given die size.

There is therefore a need for a high density semiconductor package whose attributes are minimal parasitic resistance and good heat dissipation, and that is readily manufacturable.

SUMMARY OF THE INVENTION

The present invention provides an improved semiconductor package that reduces package resistance to a negligible level, and offers superior thermal performance. Broadly, according to the present invention, a silicon die is attached to a carrier (or substrate) that has a cavity substantially surrounding the die. Direct connection of the active surface of the silicon die to the printed circuit board is then made by an array of solder bumps that is distributed across the surface of the die as well as the edges of the carrier surrounding the die. In one embodiment, the outer array of solder balls connects to a conductive carrier and provides for a low resistance connection to the back side of the die. In applications where no connection to the back side of the die is required, the carrier and the array of solder balls connecting to it may act as a thermal via for dissipating heat. Alternatively, the carrier may be of dielectric material with selective conductive traces to make selective contact to traces on the board through the outer array of solder balls. The package of the present invention also reduces the number of steps required in the assembly process flow and is manufactured using standard materials and equipment. The resulting package not only exhibits minimal resistance and improved heat dissipation, it is very thin and light as well as being cost-effective to manufacture.

Accordingly, in one embodiment, the present invention provides a semiconductor package including a carrier having a cavity sized for housing a silicon die, a silicon die having a first surface attached to the inside of the cavity, the silicon die having a thickness substantially equal to a depth of the cavity such that a second surface of the silicon die and a surface of the edges of the carrier surrounding the silicon die form a substantially uniform plane, and an array of solder balls distributed across the uniform plane connecting to the second surface of the silicon die as well as the surface of the edges of the carrier surrounding the silicon die.

In another embodiment, the present invention provides a method of packaging a silicon die including the steps of: stamping a cavity in a carrier for housing the silicon die; attaching a first surface of the silicon die inside the cavity such that a second surface of the silicon die and a surface of the edges of the carrier surrounding the silicon die form a substantially uniform plane; and disposing an array of solder balls across the substantially uniform plane with an outer array connecting to the carrier and an inner array connecting to the second surface of the silicon die.

A better understanding of the nature and advantages of the improved flip chip package of the present invention may be gained with reference to the detailed description and drawings below.

DESCRIPTION OF THE SPECIFIC EMBODIMENTS

Figure 1:
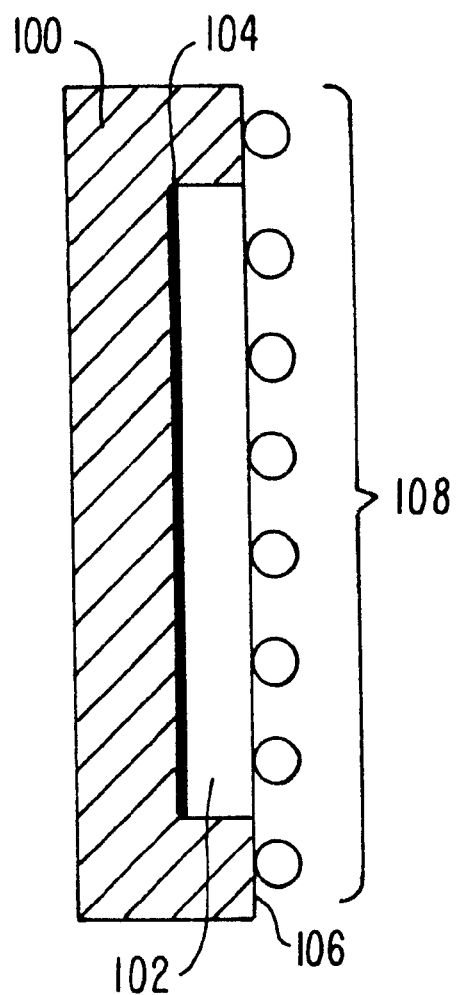
FIG. 1 is a side view of the improved flip chip package according to the present invention.

Referring to FIG. 1, there is shown a side view of the improved flip chip package according to the present invention. A carrier 100 is provided with a rectangular cavity to receive the silicon die. A silicon wafer that has been previously back lapped and metallized to product specifications is diced and a die 102 is attached inside the cavity using any one of a variety of well known die attach methods including conductive epoxy, or soft or hard solder connection. The cavity dimensions are designed such that the cavity depth is substantially equal to the thickness of die 102 plus the thickness of die attach bond line 104. This ensures that the outer surface of die 102 and the edge surface 106 of carrier 100 surrounding die 102 form a uniform plane. Solder paste is dispensed on the surface of die 102 as well as the carrier edge surface 106. The solder paste is then reflowed using conventional methodology to form solder balls 108. Alternatively, either die 102 or carrier surfaces 106, or both can be already solder bumped prior to the die attach step. Finally, the edges of die 102 may be sealed using, for example, a conventional liquid glob top epoxy. This results in a highly compact package that is light and thin. A typical silicon die may be, for example, 0.008 inches thick and the thickness of carrier 100 at the bottom of the cavity may be, for example, 0.008 inches. This results in an exemplary package that is only 0.4 millimeter in thickness (and about 0.6 millimeter with solder balls).

Figure 2:
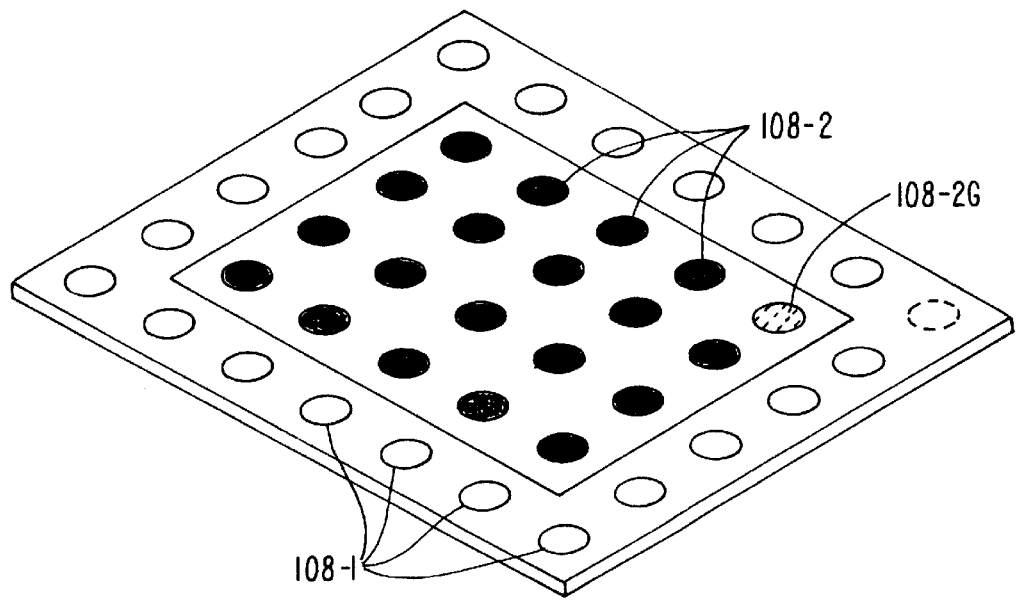
FIG. 2 illustrates the flip chip package of the present invention showing the active surface of the package with an array of solder balls.
Figure 3:
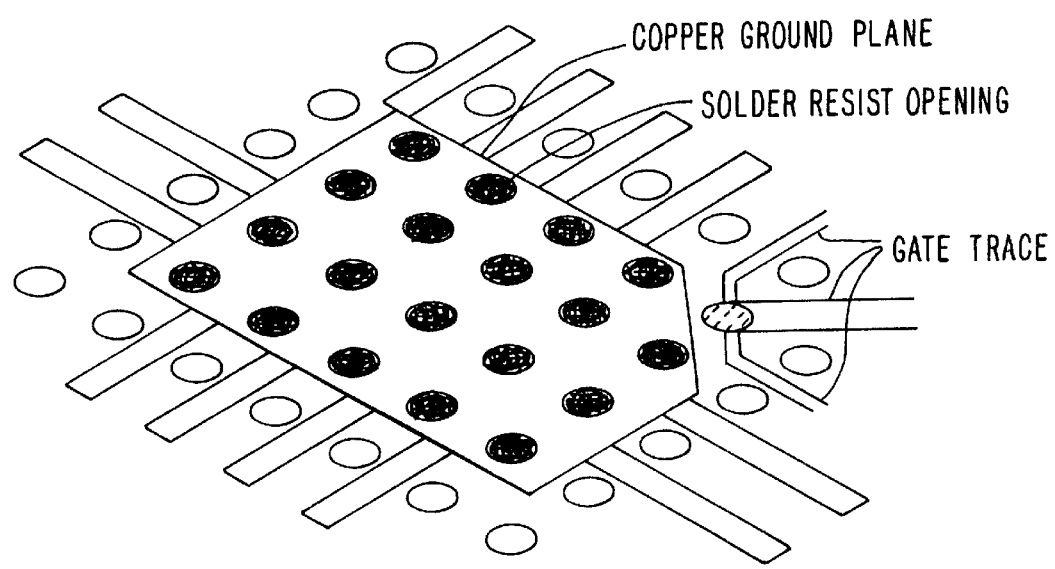
FIG. 3 shows the printed circuit board side with exemplary traces for receiving the flip chip package of the present invention.

The flip chip package of the present invention is particularly well suited for discrete products with high heat dissipation such as power switching devices (e.g., power MOSFETs) where electrical connection to the back side of the die (MOSFET drain terminal) is required. By using conductive material such as copper for carrier 100, the package of the present invention provides for a very low resistance, compact connection between the back side of the die (the drain terminal of the power MOSFET) and the PCB. FIG. 2 is a top view of the active surface of the package of the present invention showing the array of solder balls 108. The same reference numerals denote identical elements in all of the Figures. Solder ball array 108 is divided into two groups, a first outer array of solder balls 108-1 that connects to carrier edge surface 106 and an internal array of solder balls 108-2 connecting to the die surface. When housing a power MOSFET, solder balls 108-1 provide the connection to the drain terminal, and solder balls 108-2 provide the connection to the source and gate terminals. In the embodiment shown in FIG. 2, a corner solder ball 108-2G is dedicated for the gate terminal and the remaining solder balls in array 108-2 provide for a distributed, low resistance connection to the source terminal of the MOSFET. The combination of a highly conductive carrier 100 and array of solder balls 108-1 plus a distributed array of solder balls 108-2 across the surface of the die virtually eliminate the metal resistance by drastically reducing the length of the current path through the metal connections. FIG. 3 shows the printed circuit board side with exemplary traces for receiving the flip chip package shown in FIG. 2.

It is to be understood that a conductive carrier for power MOSFET applications is used herein for illustrative purposes only, and that carrier 100 may be made of dielectric material such as ceramic for various other applications. Selective contact to the back side of the die is still possible with selective conductive traces through the ceramic carrier. In cases where no contact to the back side of the die is required, a metal carrier that makes no electrical contact to the die can still be used along with solder ball array 108-1 (that may be shorted together) to form a thermal via. This provides a very efficient mechanism for dissipating heat.

Another significant advantage of the improved flip chip package of the present invention is that it not only does not introduce any steps that deviate from industry standard practices, it eliminates various steps and simplifies the process of manufacture. Because the process of manufacture for the package of the present invention follows existing standards in the industry (e.g., fine pitch ball grid array standards), the tools and infrastructure necessary to support the package such as sockets, handlers, trays and the like are well established. In terms of simplification of the process of manufacture, the entire assembly process flow for the package of the present invention is reduced to the following steps: 1) wafer saw; 2) die attach and solder ball attach; 3) third optical; 4) encapsulate; 5) test; 6) singulate; and 7) tape and reel. This eliminates the need for costly mold, trim and form equipment and a plating line. Other ball count variations of the package can be easily tooled up with an initial investment in a carrier rather than dedicated items like mold, trim and form tooling that are needed for conventional surface mount packages. This improves time to market for new form factor packages.

Figure 4:
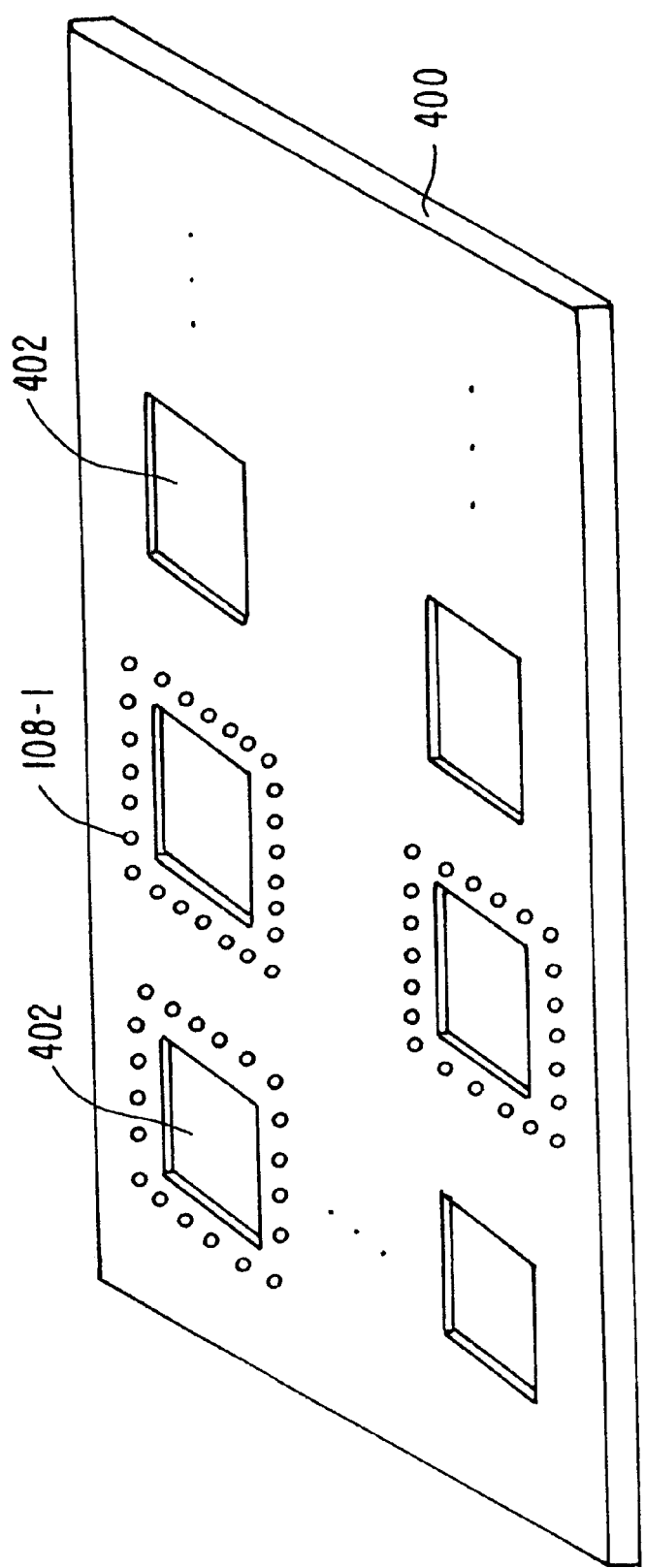
FIG. 4 shows an exemplary embodiment for a carrier panel with multiple carriers that may be used during the process flow of the flip chip package of the present invention.

Due to its relatively simple structure, a panel of carriers that receives the silicon dies is less costly compared to lead frames with intricate traces as required by conventional packaging. An exemplary panel 400 of carriers is shown in FIG. 4. Panel 400 is made of the carrier material (e.g., copper or ceramic depending on the application) with an array of identical cavities 402 stamped across its surface the dimensions of which are governed by that of the die they will house. In one embodiment, panel 400 may include the outer array of solder balls (108-1 in FIG. 2) already attached around each cavity 402 as shown. Alternatively, solder balls (108-1) may be attached later during the assembly process flow. The carriers may be tested while in a panel form and marked. The units are then individually singulated by sawing and shipped using conventional packing methods.

Thus, the present invention provides a high performance flip chip type package that offers a number of advantages over existing packaging techniques. The combination of a die attached inside a cavity of a carrier such that an array of solder balls can be disposed across both surfaces results in a highly compact, low resistance package with a simplified and thus cost effective method manufacture. The package also improves heat dissipation when the carrier is made of a highly conductive material acting as a thermal via. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A method for packaging a silicon die comprising the steps of:

stamping a cavity in a carrier for housing the silicon die;

attaching a first surface of the silicon die inside the cavity such that a second surface of the silicon die and a surface of the edges of the carrier surrounding the silicon die form a substantially uniform plane; and disposing an array of solder balls across the substantially uniform plane with an outer array being disposed directly on the carrier and an inner array being disposed directly on the second surface of the silicon die.

2. The method for packaging a silicon die as in claim 1 wherein said carrier is in a panel form and said step of stamping stamps a plurality of cavities across the panel.

3. The method for packaging a silicon die as in claim 2 further comprising the step of singulating the panel into plural units.

4. The method for packaging a silicon die as in claim 1 wherein the step of disposing an array of solder balls occurs prior to the attaching step and comprises a step of forming solder balls on the second surface of the silicon die, and a step of forming solder balls on the surface of the edges of the carrier.

* * * * *